(12) United States Patent
Agarwal

(10) Patent No.: US 8,295,794 B2
(45) Date of Patent: Oct. 23, 2012

(54) SYSTEM AND METHOD FOR POWER CONTROL FOR A SURFACE ACOUSTIC WAVE (SAW) FILTER-LESS TRANSMITTER

(75) Inventor: Bipul Agarwal, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 393 days.

(21) Appl. No.: 12/646,127

(22) Filed: Dec. 23, 2009

(65) Prior Publication Data

US 2011/0151808 A1    Jun. 23, 2011

(51) Int. Cl.
*H01Q 11/12* (2006.01)

(52) U.S. Cl. ............ 455/127.1; 455/522; 455/13.4; 455/114.3; 455/127.2; 330/296; 330/284; 330/285; 330/289

(58) Field of Classification Search ............ 455/522, 455/13.4, 91, 114.3, 127.1, 127.2, 127.3, 455/135, 136, 138, 232.1, 245.1; 330/296, 330/285, 284, 289, 305, 292, 293, 311
See application file for complete search history.

(56) References Cited

U.S. PATENT DOCUMENTS

| | | | |
|---|---|---|---|
| 7,756,003 B1* | 7/2010 | Lee et al. | 370/208 |
| 2004/0185814 A1* | 9/2004 | Inamori et al. | 455/232.1 |
| 2006/0057982 A1* | 3/2006 | Inamori et al. | 455/127.2 |

* cited by examiner

*Primary Examiner* — Tuan Pham
(74) *Attorney, Agent, or Firm* — Knobbe Martens Olson & Bear, LLP

(57) ABSTRACT

A power control system includes a transmitter having a plurality of gain-adjustable elements, a switchable attenuator located at an output of the transmitter, a gain-adjustable power amplifier coupled to the attenuator, and a power control element responsive to a power target signal, the power control element configured to calculate and apply a gain control signal to the plurality of gain-adjustable elements in the transmitter, to the switchable attenuator, and to the gain-adjustable power amplifier so that a signal to noise ratio (SNR) at the output of the transmitter remains substantially constant over a range of output power.

14 Claims, 9 Drawing Sheets

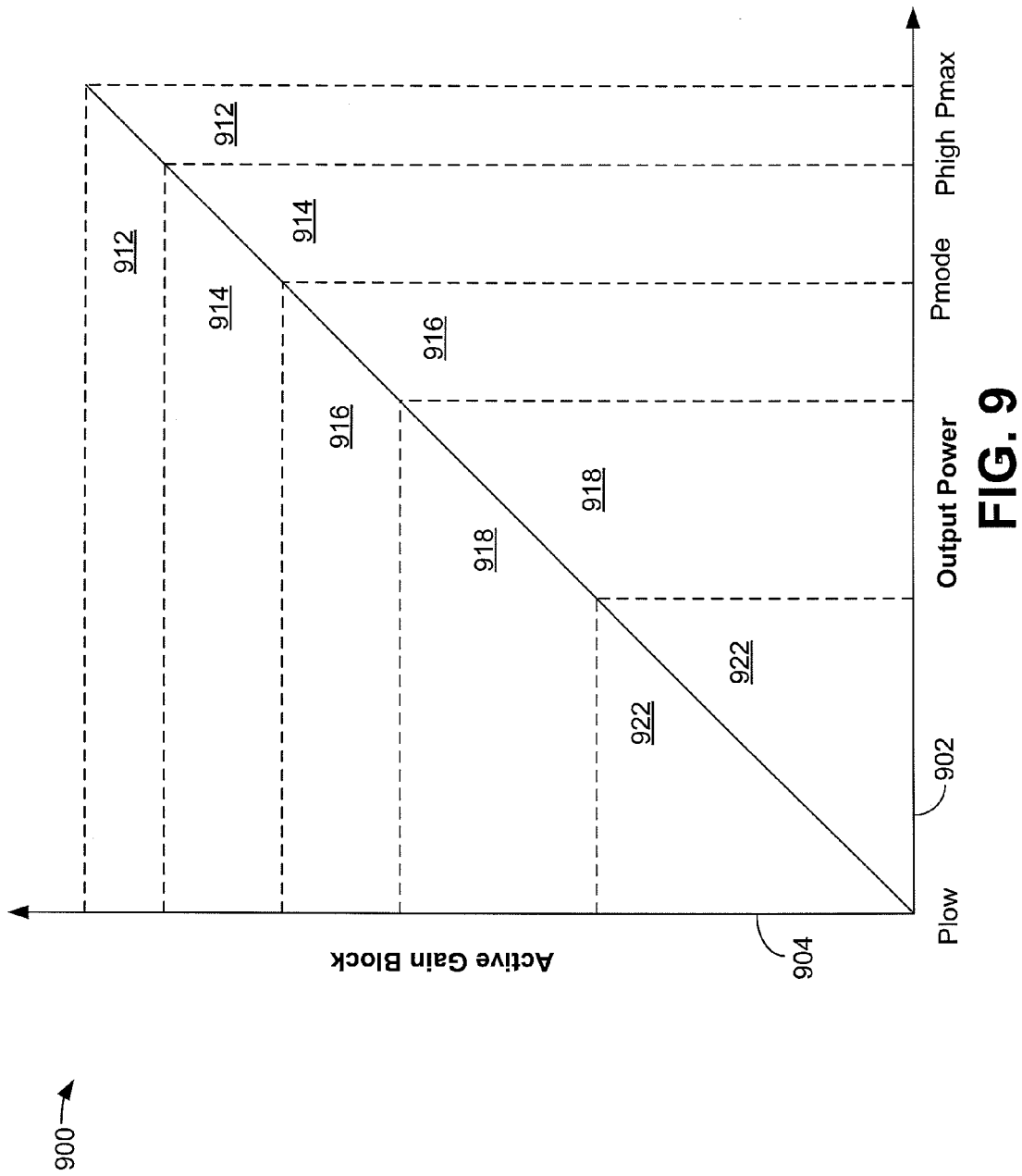

SYSTEM AND METHOD FOR POWER CONTROL FOR A SURFACE ACOUSTIC WAVE (SAW) FILTER-LESS TRANSMITTER

BACKGROUND

Portable communication devices, such as cellular telephones, personal digital assistants (PDAs), WiFi transceivers, and other communication devices transmit and receive communication signal at various frequencies that correspond to different communication bands and at varying power levels. A typical transmitter in one of these communication devices must be capable of sending an information signal at radio frequency (RF) at a precise power level that is controlled continuously, or in small steps, over a range of approximately 90 dB. The power output of the communication device must take into account stringent operating specifications, must be substantially linear and must meet various noise and signal quality requirements.

A typical transmit system employs baseband-to-RF signal upconversion, has a power amplifier to amplify the information signal prior to transmission, and employs various impedance matching circuitry, switches, duplexers, diplexers and signal filtering circuitry. Each of these systems and elements introduces gain variations which can occur over specific components, over temperature and over frequency, thus making precise open-loop power control difficult to achieve. Power control can also be performed using a closed-loop architecture, but closed-loop power control uses additional hardware, software, calibration and battery power, has several control and timing issues and is generally problematic.

The output of the power amplifier (PA) contains the desired transmit information signal in the transmit band and also includes unwanted noise that occurs at frequencies occupied by the receive band. This unwanted noise in the receive band is created by various components in the transmitter and leaks to the input of the receiver due to finite isolation provided by elements located between the PA and the antenna. The receiver input contains the desired receive signal in the receive-band and also contains the unwanted noise that has leaked from the transmitter. Together with noise generated by the receiver, this additional noise at the receiver input results in a degraded signal-to-noise ratio (SNR) for the receiver, thus degrading its sensitivity (ability to detect weak signals). Frequently, systems employ one or more surface acoustic wave (SAW) filters between the transmitter and the PA to reduce this unwanted noise before it leaks to the receiver. However, for multiband systems, multiple SAW filters add significantly to the cost and physical size of the communication system.

For SAW-less systems, the requirements on the transmitter noise in the receive-band are much more stringent. As the transmit system gain varies from device-to-device and over frequency and temperature, the transmitter output power needs to be adjusted precisely to keep the final transmitted power at the antenna constant as required by the receiving base station. Typically, when the transmitter power is changed, its output noise also changes. However, it is required that the SNR at the transmitter output be kept constant to prevent any further de-sensitization of the receiver. This is especially important in the high-power range when the device is farthest from the basestation and the receive signal is at its weakest level.

Therefore, it would be desirable to have a transmitter system that maintains a constant SNR over a range of output power, and, a way of precisely controlling the gain of the various elements in the transmitter system so that receive band noise can be kept below a desired level and the overall power output at the antenna can be precisely controlled over a desired operating range.

SUMMARY

Embodiments of a power control system include a transmitter having a plurality of gain-adjustable elements, a switchable attenuator located at an output of the transmitter, a gain-adjustable power amplifier coupled to the attenuator, and a power control element responsive to a power target signal, the power control element configured to calculate and apply a gain control signal to the plurality of gain-adjustable elements in the transmitter, to the switchable attenuator, and to the gain-adjustable power amplifier so that a signal to noise ratio (SNR) at the output of the transmitter remains substantially constant over a range of output power.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

FIG. 9 is a graphical illustration showing five power control regions controlled by the power control element.

DETAILED DESCRIPTION

Figure 1:
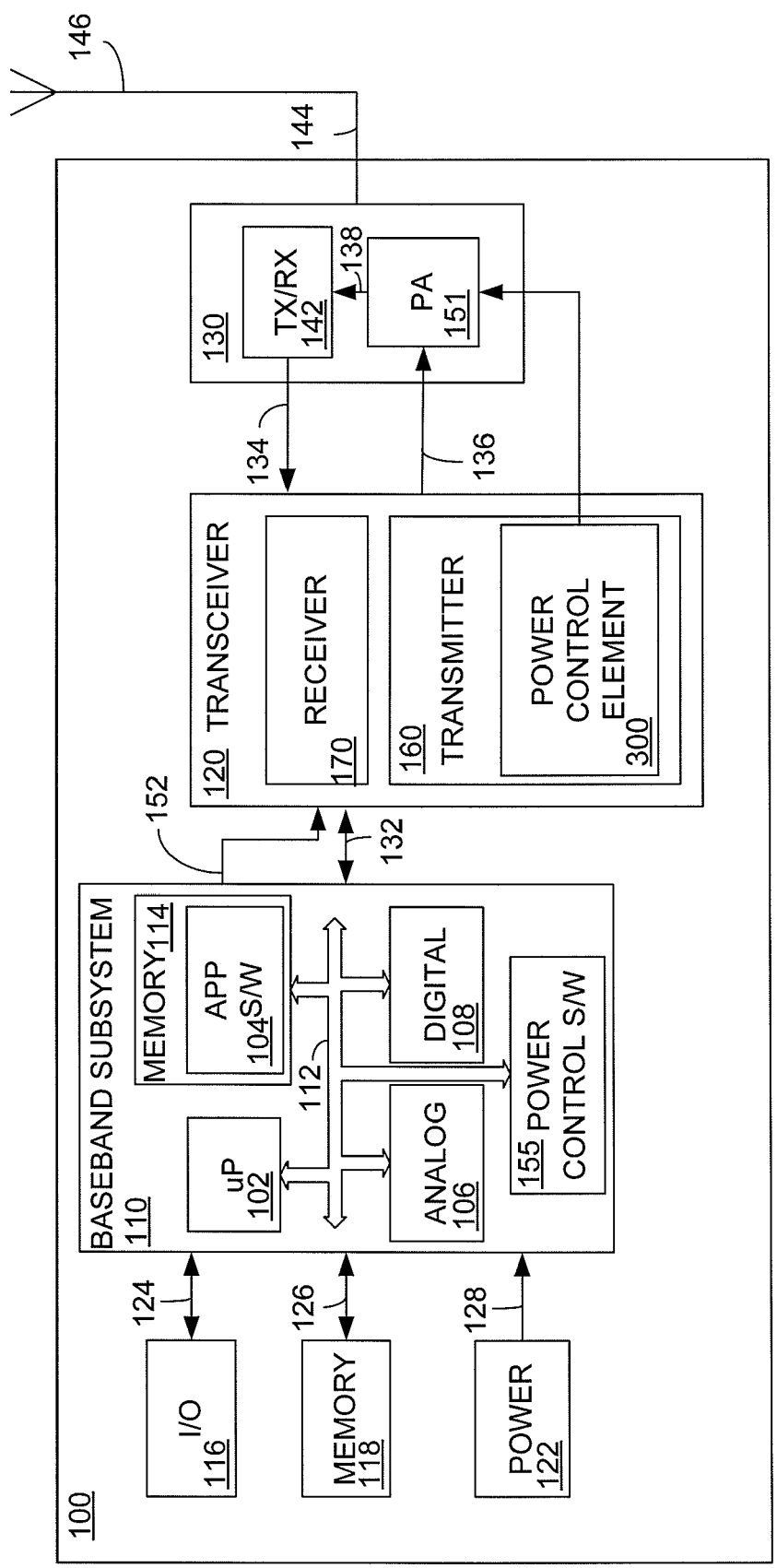
FIG. 1 is a block diagram illustrating a simplified portable communication device.

Although described with particular reference to a portable communication device, such as a portable cellular telephone or a personal digital assistant (PDA), the system and method for power control for a surface acoustic wave (SAW) filter-less transmitter can be used in any device or system that amplifies and transmits a variable-power radio frequency (RF) signal using an amplifier. The system and method for power control for a surface acoustic wave (SAW) filter-less transmitter, hereafter referred to as the system and method for power control, can be implemented as part of an integrated module that contains other circuit elements, or can be implemented as a discrete module. The system and method for power control provides for a substantially constant signal-to-noise ratio (SNR) at the output of a transmitter, thus minimizing unwanted transmit noise at an input to a receiver. While described in the context of an open-loop power control system, the system and method for power control can also be implemented in a closed-loop power control system, or in any transmitter system where it is desirable to minimize the intrusion of transmitter noise in a receive frequency band.

The system and method for power control can be implemented in hardware, and, in an embodiment, can be controlled by software or firmware components. The hardware portion of the system and method for power control can be implemented using specialized hardware elements and control logic. When control components of the system and method for power control are implemented, at least partially in software, or implemented in a system that employs software control of various elements or components, the software portion can be used to precisely control the various components of the modulator, upconverter, attenuator and power amplifier that are present in a transmit system. The software can be stored in a memory and executed by a suitable instruction execution system (microprocessor). The hardware implementation of the system and method for power control can include any or a combination of the following technologies, which are all well known in the art: discrete electronic components, integrated electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the system and method for power control comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

FIG. 1 is a block diagram illustrating a simplified portable communication device 100. In an embodiment, the portable communication device 100 can be a portable cellular telephone. Embodiments of the system and method for power control can be implemented in any device having an RF transmitter, and in this example, are implemented in a portable communication device 100. The portable communication device 100 illustrated in FIG. 1 is intended to be a simplified example of a cellular telephone and to illustrate one of many possible applications in which the system and method for power control can be implemented. One having ordinary skill in the art will understand the operation of a portable cellular telephone, and, as such, implementation details are omitted. The portable communication device 100 includes a baseband subsystem 110, a transceiver 120, and a front end module (FEM) 130. The transceiver 120 includes a transmitter 160 and a receiver 170. Although not shown for clarity in FIG. 1, the transmitter 160 generally includes filtering, modulation and upconversion circuitry for preparing a baseband information signal for amplification and transmission, and includes a power control element 300. Although not shown for clarity in FIG. 1, the receiver 170 generally includes filtering and downconversion circuitry for receiving and downconverting an RF signal to a baseband information signal to recover data. The details of the operation of the transceiver 120 are known to those skilled in the art.

The baseband subsystem generally includes a processor 102, which can be a general purpose or special purpose microprocessor, memory 114, application software 104, analog circuit elements 106, digital circuit elements 108 and power control software 155, coupled over a system bus 112. The system bus 112 can include the physical and logical connections to couple the above-described elements together and enable their interoperability.

An input/output (I/O) element 116 is connected to the baseband subsystem 110 over connection 124, a memory element 118 is coupled to the baseband subsystem 110 over connection 126 and a power source 122 is connected to the baseband subsystem 110 over connection 128. The I/O element 116 can include, for example, a microphone, a keypad, a speaker, a pointing device, user interface control elements, and any other device or system that allows a user to provide input commands and receive outputs from the portable communication device 100.

The memory 118 can be any type of volatile or non-volatile memory, and in an embodiment, can include flash memory. The memory element 118 can be permanently installed in the portable communication device 100, or can be a removable memory element, such as a removable memory card.

The power source 122 can be, for example, a battery, or other rechargeable power source, or can be an adaptor that converts AC power to the correct voltage used by the portable communication device 100. In an embodiment, the power source can be a battery that provides a nominal voltage output of approximately 3.0 volts (V). However, the output voltage range of the power source can range from approximately 1.0 to 5.0 V.

The processor 102 can be any processor that executes the application software 104 to control the operation and functionality of the portable communication device 100. The memory 114 can be volatile or non-volatile memory, and in an embodiment, can be non-volatile memory that stores the application software 104. Portions of the control logic of the system and method for power control are implemented in software. Accordingly, the baseband subsystem 110 also includes power control software 155, which may cooperate with control logic that can be executed by the microprocessor 102, or by another processor, to control at least some aspects of the operation of the system and method for power control to be described below.

The analog circuitry 106 and the digital circuitry 108 include the signal processing, signal conversion, and logic that convert an input signal provided by the I/O element 116 to an information signal that is to be transmitted. Similarly, the analog circuitry 106 and the digital circuitry 108 include the signal processing, signal conversion, and logic that convert a received signal provided by the transceiver 120 to an information signal that contains recovered information. The digital circuitry 108 can include, for example, a digital signal processor (DSP), a field programmable gate array (FPGA), or any other processing device. Because the baseband subsystem 110 includes both analog and digital elements, it is sometimes referred to as a mixed signal device (MSD).

In an embodiment, the front end module 130 includes a transmit/receive (TX/RX) switch 142 and a power amplifier 151. The TX/RX switch 142 can be a duplexer, a diplexer, or any other physical or logical device or circuitry that separates a transmit signal and a receive signal. Depending on the implementation of the portable communication device 100, the TX/RX switch 142 may be implemented to provide half-duplex or full-duplex functionality. A transmit signal provided by the transceiver 120 over connection 136 is directed to the power amplifier 151. The output of the power amplifier 151 is provided over connection 138 to the TX/RX switch 142, and then to an antenna 146 over connection 144.

A signal received by the antenna 146 is provided over connection 144 to the TX/RX switch 142, which provides the received signal over connection 134 to the transceiver 120. The receive signal is processed by the receiver 170 to extract the information signal which is provided to the baseband subsystem 110.

In an embodiment, the baseband subsystem 110 provides one or more control signals to the transceiver 120 over connection 132. Connection 132 can be implemented as discrete connections, or as a bus having multiple signals. In an embodiment, a power signal, referred to a Ptarget, one or more reference voltage levels, temperature information relating to the temperature of the baseband subsystem 110, frequency band/channel number and other control signals can be provided over connection 152 to the transceiver 120, and in particular, to the power control element 300.

Figure 2:
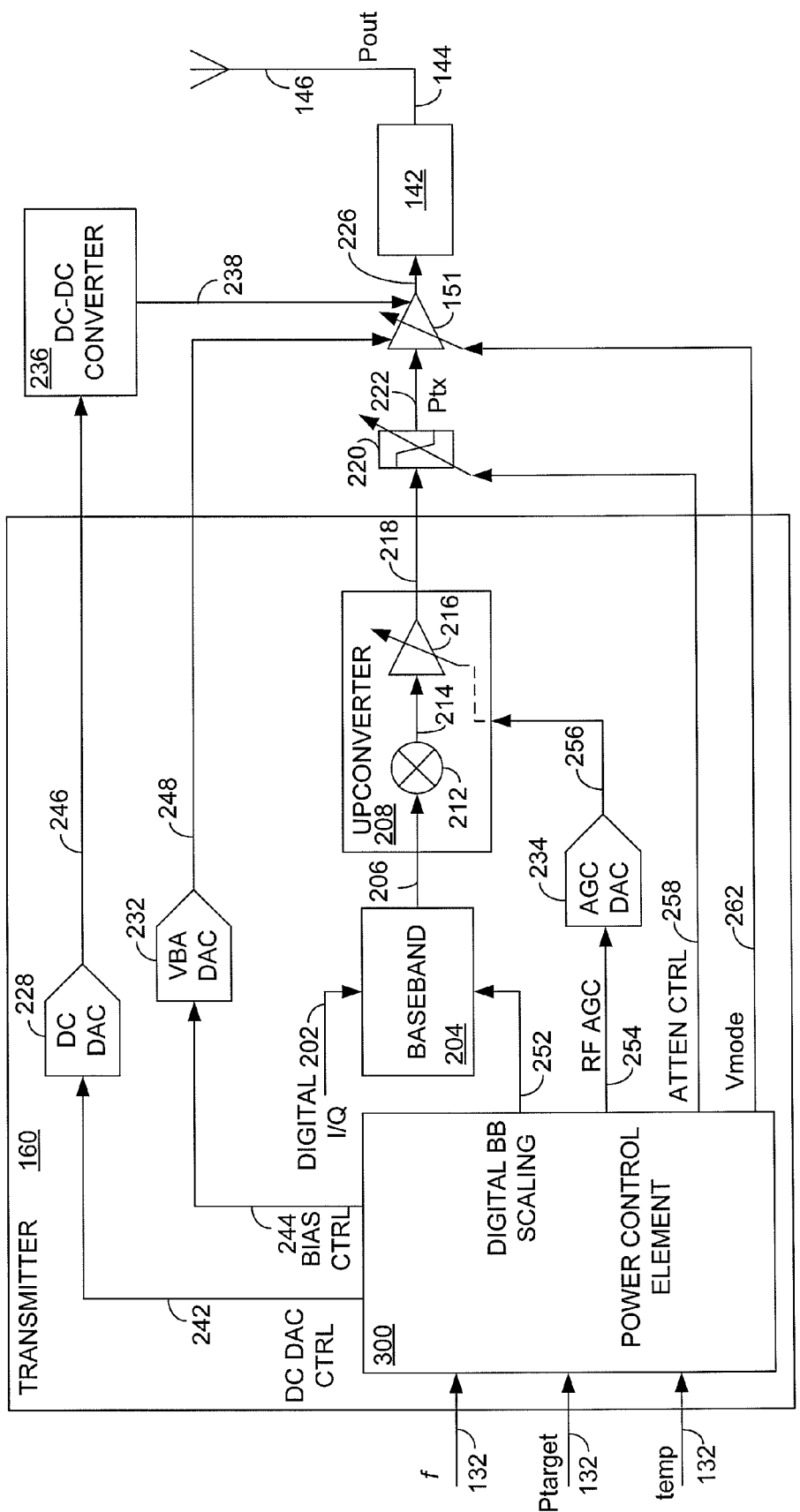
FIG. 2 is a block diagram illustrating an embodiment of a transmitter (FIG. 1) including an embodiment of the power control element of FIG. 1.

FIG. 2 is a block diagram illustrating an embodiment of a transmitter 160 (FIG. 1) including an embodiment of the power control element 300 of FIG. 1. The transmitter 160 comprises a baseband section 204 coupled to an upconverter 208 over connection 206. Digital in-phase (I) and quadrature (Q) data is provided to the baseband section 204 over connection 202. The signals on connection 202 represent the information signal that is to be transmitted. The baseband section 204 generally comprises digital filtering, gain/phase control, a digital-to-analog converter (DAC), and analog filtering, as known to one skilled in the art. The upconverter 208 comprises a mixer 212 and a radio frequency (RF) variable gain amplifier (VGA), operating as a power amplifier driver 216. The mixer 212 is connected to the driver 216 over connection 214. The output of the driver 216 is provided over connection 218 to an attenuator 220. The attenuator 220 is a switchable attenuator, can have a fixed or variable attenuation value, and is typically implemented as a step attenuator having 3 or 4 bit digital control resulting in steps on the order of 1 dB. Whether having a fixed or variable attenuation value, the switchable attenuator 220 can be included in the circuit or can be bypassed. The switchable attenuator 220 can be switched in and out of the circuit, depending on factors such as, for example, the desired power output, using a control signal, using a gain adjustment signal, using a bypass circuit, or by using any other way of controlling whether the switchable attenuator 220 is in the circuit. Further, the switchable attenuator 220 can be fabricated as part of the transmitter 160, as a stand-alone element, or as part of the power amplifier 151.

The output of the attenuator 220 is a signal referred to as Ptx and is provided over connection 222 to a power amplifier 151. The output of the power amplifier 151 is provided over connection 226 to the TX/RX switch 142. The output of the TX/RX switch 142 is the power output signal, Pout, and is provided over connection 144 to the antenna 146. The attenuator 220 located following the upconverter 208 and just prior to the power amplifier 151 maintains a high constant signal to noise ratio (SNR) across its attenuation control range.

The transmitter 160 also includes an embodiment of the power control element 300. The power control element 300 can be implemented as a combination of hardware, firmware and software. For example, the software and firmware portions of the power control element 300 can be executed by the processor 102 (FIG. 1) and can be embodied in the power control software 155 located in the baseband subsystem 110 (FIG. 1). While the power control element 300 may also be implemented in hardware, using for example, add and shift operations, a software/firmware implementation provides additional flexibility. The power control element 300 receives the power target signal, Ptarget, temperature information, and the operating frequency information over connection 132 from the baseband subsystem 110 and calculates and provides various gain control signals to a number of gain-adjustable elements within the transmitter 160, provides a control signal to the switchable attenuator 220, and provides gain control signals to the power amplifier 151. For example, the total gain provided by the transmitter 160 is distributed over the baseband section 204, the upconverter 208, the switchable attenuator 220 and the power amplifier 151, and controlled by the power control element 300.

A digital baseband scaling signal is calculated and provided over connection 252 to the baseband section 204 to control its gain. An RF automatic gain control (AGC) signal is provided over connection 254 to an AGC digital-to-analog converter (DAC) 234. The AGC DAC 234 develops an analog gain control signal which is provided over connection 256 to the upconverter 208. The RF gain control provided by the AGC DAC 234 controls the gain of the driver 216. Generally, the gain control provided by the digital baseband scaling signal on connection 252 and the RF gain control provided by the AGC DAC 234 are split by a predetermined ratio based on component evaluation and a limit is generally set on the digital scaling. For example, a split of 20% digital and 80% RF gain control can be provided by the combination of the digital baseband scaling and the RF gain control to provide, for example, approximately 2 dB digital gain control and approximately 8 dB RF gain control for a total of approximately 10 dB gain control.

An attenuator control signal is provided over connection 258 to the switchable attenuator 220. The switchable attenuator 220, being located between the driver 216 and the power amplifier 151, allows the transmitter 160 to meet stringent receive band noise specifications when the receiver 170 (FIG. 1) is implemented without a SAW filter. To meet stringent receive band noise specifications, and to keep noise at the input to a receiver below a predetermined level, which may vary from communication standard to communication standard, the switchable attenuator 220 maintains a constant signal-to-noise ratio (SNR) entering the power amplifier 151.

The response of the components following the switchable attenuator 220 typically vary from device to device (such as from portable communication device to portable communication device) and vary over frequency and temperature. However, the power appearing at the antenna 146 and the noise in receive band should be same in all cases. The switchable attenuator 220 achieves both since it attenuates both signal and noise by the same ratio without contributing appreciable noise of its own. Moreover, in certain operating embodiments, such as in a low gain operating mode where receive-band noise is not problematic, the switchable attenuator 220 can be disabled and system gain control achieved by controlling the gain applied by the baseband section 204 and the upconverter 208 in order to conserve battery power.

A gain mode signal, referred to as Vmode, is provided from the power control element 300 over connection 262 to the power amplifier 151. The gain mode signal on connection 262 is responsive to the desired output power, Pout, and causes the power amplifier 151 to either operate in a low gain mode or a high gain mode.

The power control element 300 also develops a bias control signal over connection 244. The bias control signal is provided to a VBA (voltage bias adjustment) DAC 232. The output of the VBA DAC 232 is provided over connection 248 and is an analog bias control signal that controls the quiescent bias current of the power amplifier 151.

A DC DAC control signal is provided by the power control element 300 over connection 242 to a DC DAC 228. The DC DAC 228 provides a DC DAC control signal over connection 246 to a DC-DC converter 236. The DC-DC converter 236 controls the DC supply voltage provided to the power amplifier 151 over connection 238, thereby controlling the efficiency of the power amplifier 151 over a range of power levels.

The power control element 300 precisely controls the power output, Pout, to a value between a maximum power Phigh and a minimum power Plow, depending on the value of the target power signal, Ptarget, and, in some embodiments, the temperature and the operating frequency. In this manner, by precisely controlling the gain of the various gain-controllable elements within the transmitter 160 and the gain-controllable power amplifier 151, power consumption is minimized. In an embodiment, the baseband section 204 can be controlled to provide approximately 6 dB of gain control range, the upconverter 208 can be controlled to provide approximately 70 dB of gain control range, the switchable attenuator 220 can be controlled to provide approximately 10 dB of gain control range, and the power amplifier 151 can be controlled to provide approximately 14 dB of gain control range, for a total gain adjustability of approximately 100 dB. While generally it is desired to have 90 dB of gain adjustment, it is also desirable to include additional margin.

Figure 3:
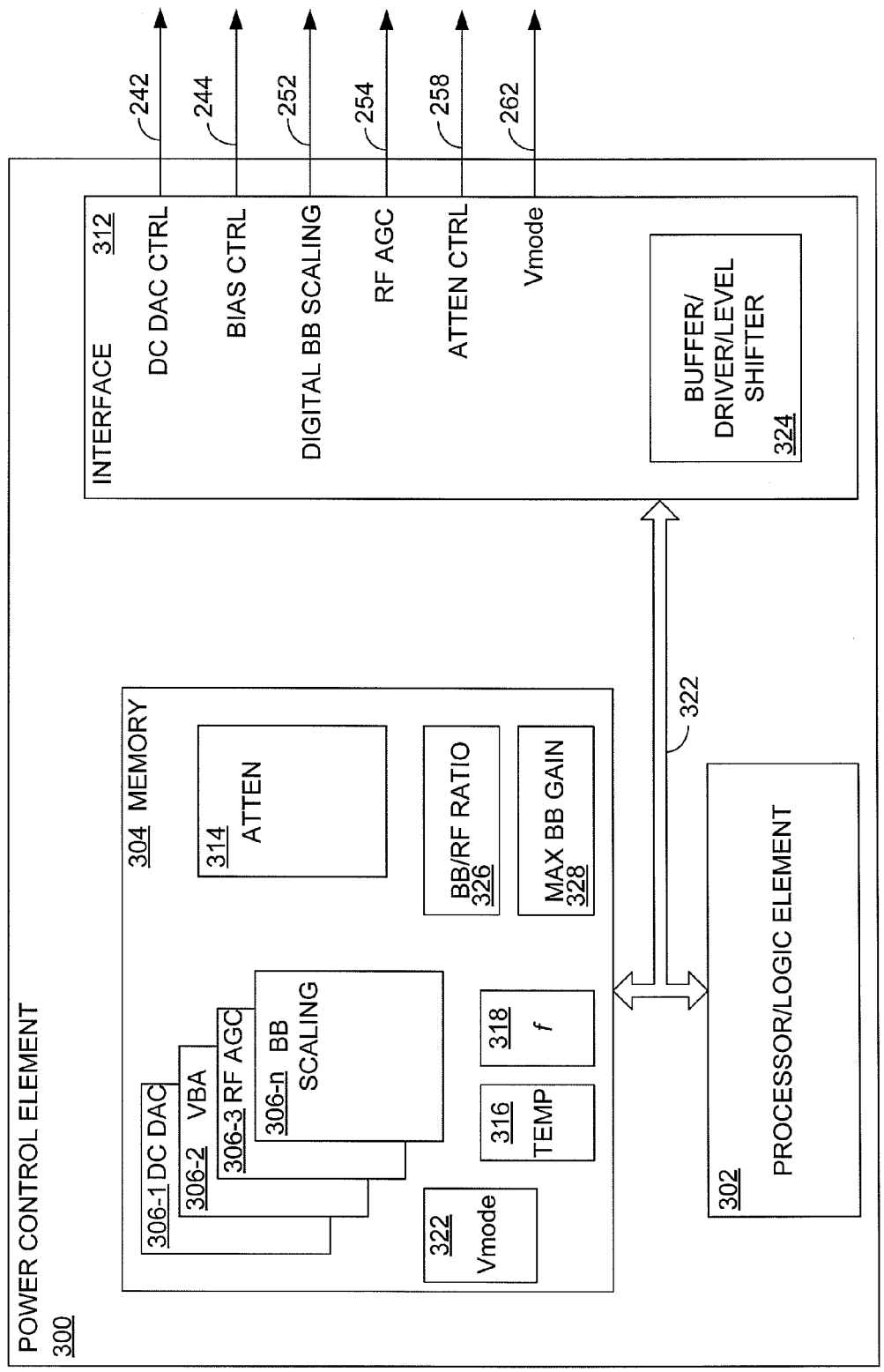
FIG. 3 is a block diagram showing an embodiment of the power control element.

FIG. 3 is a block diagram showing an embodiment of the power control element 300. The power control element 300 comprises a logic element 302, a memory 304 and an interface 312 coupled over a system bus 322. The logic element 302 can be implemented as using combinational logic, or can be implemented as a processor. The logic element 302 receives the power target signal, Ptarget, temperature information and the operating frequency over connection 132 from the baseband subsystem 110.

The memory 304 can be any volatile or nonvolatile memory element, can be a portion of the memory 114 of FIG. 1, or can be a dedicated memory that stores various portions of the power control software 155. The memory 304 also stores a number of lookup tables relating to the gain adjustable elements of FIG. 2. For example, the memory 304 contains tables 306-1 through 306-n. The table 306-1 contains the lookup table relating to the value of the signal supplied to the DC DAC 228 of FIG. 2, the table 306-2 contains the lookup table relating to the value of the signal provided to the VBA DAC 232 of FIG. 2, the table 306-3 contains the lookup table relating to the value of the signal provided to the AGC DAC 234 of FIG. 2 and the table 306-n contains the lookup table relating to the value of the digital baseband scaling signal provided over connection 252 of FIG. 2.

Moreover, the memory 304 contains a temperature offset table 316, a frequency offset table 318, a Vmode table 322, and, in an embodiment that employs a variable attenuator 220, may also contain an attenuator table 314 to control and determine the value of the switchable attenuator 220 if it is implemented as a variable attenuator. The memory 304 also contains preset values 326 for the gain split ratio applied by the baseband section 204 and the upconverter 208, and preset values 328 for the maximum baseband gain control limit that can be applied.

The interface 312 provides the signal outputs described above. The DC DAC control signal is provided over connection 242, the bias control signal is provided over connection 244, the digital baseband scaling signal is provided over connection 252, the signal to the RF AGC DAC is provided over connection 254, the attenuator control signal is provided over connection 258 and the voltage mode signal Vmode is provided over connection 262. These signals are buffered, shifted to an appropriate level, and driven by buffer/driver/level shift element 324.

Figure 4:
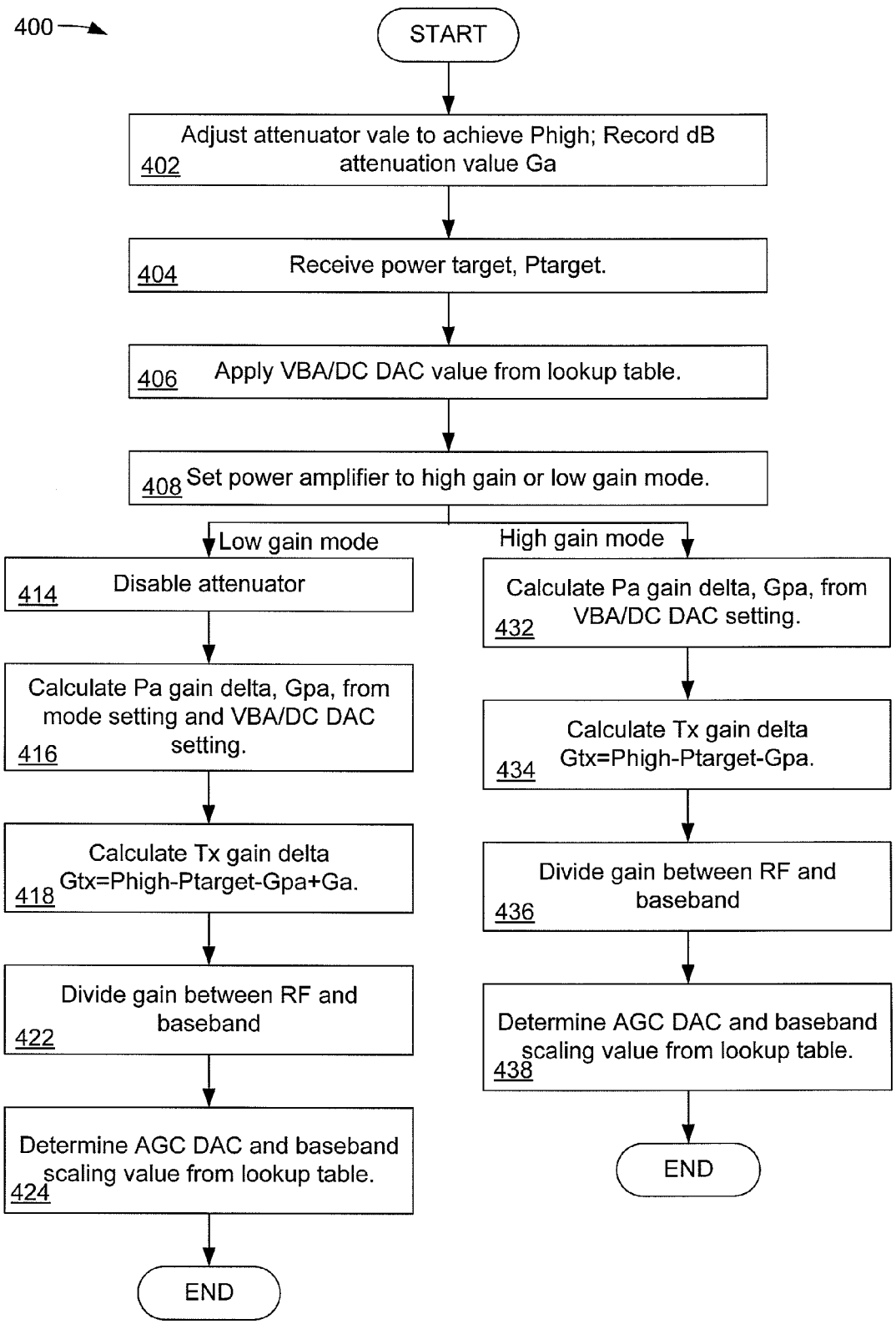
FIG. 4 is a flowchart describing the operation of an embodiment of the power control element in which the attenuator of FIG. 2 is a fixed value attenuator.

FIG. 4 is a flowchart describing the operation of an embodiment of the power control element 300 in which the switchable attenuator 220 of FIG. 2 is a fixed value attenuator. In block 402 the value of the switchable attenuator 220 is adjusted, set, or otherwise controlled, to achieve a high power level Phigh. The dB attenuation value associated with Phigh is recorded as the value, Ga.

In block 404 the power target level, Ptarget, is received from the baseband subsystem 110. In block 406, the DC DAC control signal (connection 242) and the bias control signal (connection 244) are applied to the DC DAC 228 and the VBA DAC 232, respectively, based on the values in the associated lookup tables. For example, the DC DAC control signal is provided over connection 242 based on the value in the lookup table 306-1 and the bias control signal is provided over connection 244 based on the value in the lookup table 306-2.

In block 408, the voltage mode signal, Vmode, on connection 262 is set to cause the power amplifier 151 to operate in either low gain mode or high gain mode. If the power amplifier 151 is set in low gain mode, then, in block 414, the switchable attenuator 220 is disabled. Disabling the switchable attenuator 220 when it is not needed, for example when the power amplifier 151 is set in low gain mode, conserves battery power and extends the battery life of the communication device 100. Such control of the switchable attenuator 220 and optimization of the use of the switchable attenuator 220 taking into account the operating condition of the power amplifier 151 can be referred to as "smart" attenuator control because the switchable attenuator is activated only when needed (e.g., when the power amplifier 151 is operated in high gain mode) to control noise in the receive band. When the switchable attenuator 220 is not needed (e.g., when the power amplifier 151 is operated in low gain mode) the switchable attenuator 220 is disabled, thus reducing power consumption.

In block 416 the power amplifier gain delta, Gpa, is calculated based on the Vmode signal on connection 262 and based on the DC DAC control signal on connection 242 and the bias control signal on connection 244. The power amplifier gain delta, Gpa, refers to the gain change of the power amplifier 151 as a result of the DC DAC signal on connection 246 and the VBA bias control signal on connection 248.

In block 418, the appropriate transmit gain change (delta), Gtx, is calculated. The transmit gain change, Gtx, is calculated according to Gtx=Phigh−Ptarget−Gpa+Ga. Gain is noted in dB and power is noted in dBm. For example, if Phigh is 24 dBm and Ptarget is 0 dBm, Gpa is 15 dB, and Ga is 6 dB, then Gtx is 15 dB.

In block 422, the RF AGC gain signal and the digital baseband scaling signal, is split using a programmed 80%-20% ratio where 80% of the gain relates to the RF gain control signal and is applied to the upconverter 208 over connection 256 and 20% of the gain is applied to the baseband section 204 over connection 252. Other RF AGC/baseband ratios can be implemented, based on system requirements.

In block 424, the RF AGC signal is determined based on the values in the lookup table 306-3 and applied to the upconverter 208; and the digital baseband scaling signal on connection 252 is determined based on the values in the lookup table 306-n and is applied to the baseband section 204 in the proportions described above.

If the power amplifier 151 is set in the high gain mode, then, in block 432, the power amplifier gain delta, Gpa, is calculated based on the DC DAC control signal on connection 242 and the bias control signal on connection 244.

In block 434, the appropriate transmit gain delta, Gtx, is calculated. The transmit gain, Gtx, is calculated according to Gtx=Phigh−Ptarget−Gpa. Gain is noted in dB and power is noted in dBm. For example, if Phigh is 24 dBm, Ptarget is 10 dBm and Gpa is 10 dB, then Gtx is 4 dB.

In block 436, the RF AGC gain signal and the digital baseband scaling signal, is split using the programmed 80%-20% ratio where 80% of the gain relates to the RF gain control signal and is applied to the upconverter 208 over connection 256 and 20% of the gain is applied to the baseband section 204 over connection 252.

In block 438, the RF AGC signal is determined based on the values in the lookup table 306-3 and applied to the upconverter 208; and the digital baseband scaling signal on connection 252 is determined based on the values in the lookup table 306-n and is applied to the baseband section 204 in the proportions described above.

Figure 5:
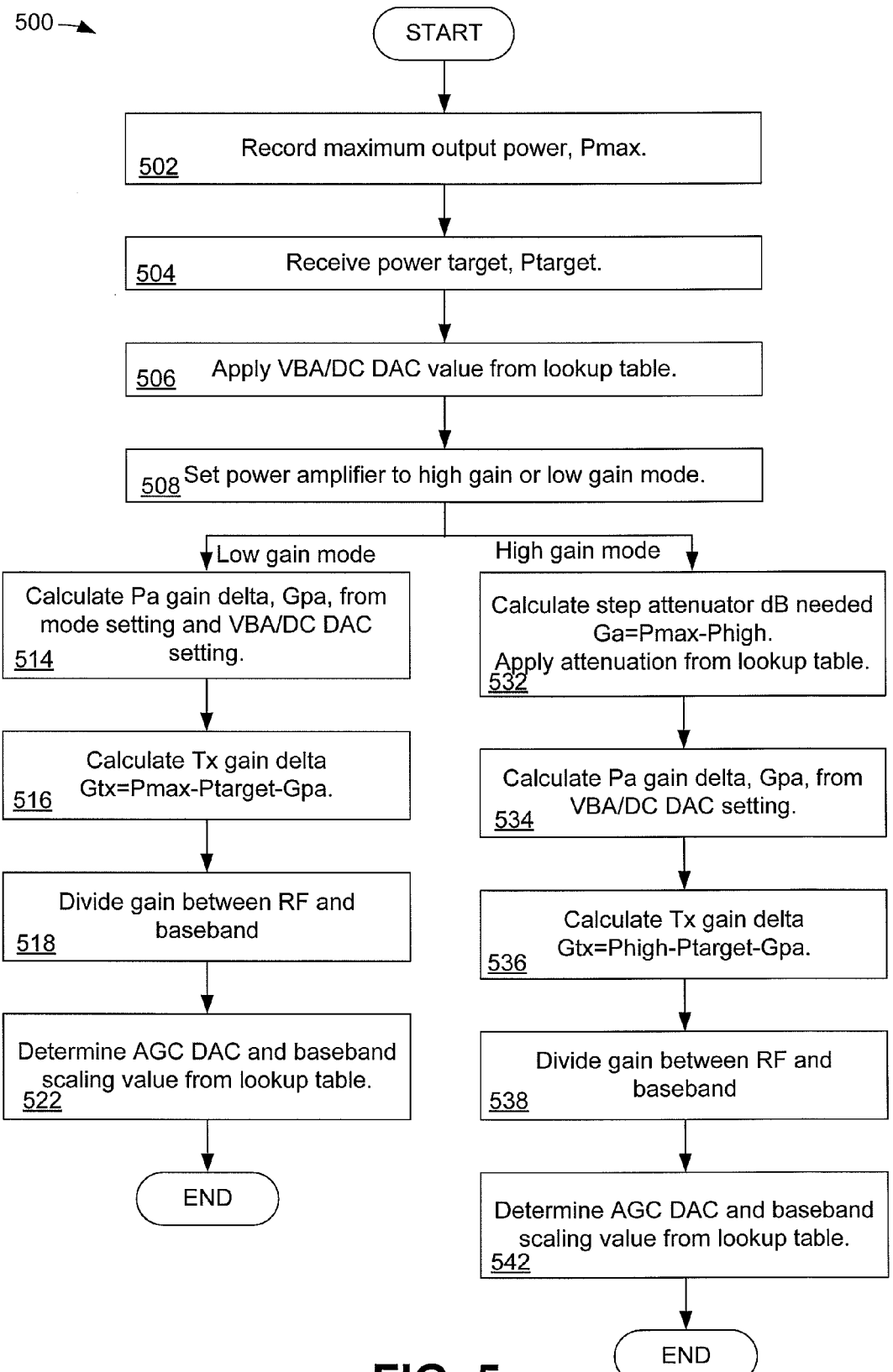
FIG. 5 is a flowchart describing the operation of an embodiment of the power control element in which the attenuator of FIG. 2 is a variable value attenuator.

FIG. 5 is a flowchart describing the operation of an embodiment of the power control element in which the switchable attenuator 220 is a variable value attenuator. In block 502, the maximum output power, Pmax, is determined and recorded in the attenuator table 314 in FIG. 3.

In block 504, the power target level, Ptarget, is received from the baseband subsystem 110. In block 506, the DC DAC control signal (connection 242) and the bias control signal (connection 244) are applied to the DC DAC 228 and the VBA DAC 232, respectively, based on the values in the associated lookup tables. For example, the DC DAC control signal is provided over connection 242 based on the value in the lookup table 306-1 and the bias control signal is provided over connection 244 based on the value in the lookup table 306-2.

In block 508, the voltage mode signal, Vmode, on connection 262 is set to cause the power amplifier 151 to operate in either low gain mode or high gain mode. If the power amplifier 151 is set in low gain mode, then, in block 514, the power amplifier gain delta, Gpa, is calculated based on the Vmode signal on connection 262 and based on the DC DAC control signal on connection 242 and the bias control signal on connection 244.

In block 516, the appropriate transmit gain delta, Gtx, is calculated. The transmit gain, Gtx, is calculated according to Gtx=Pmax−Ptarget−Gpa.

In block 518, the RF AGC gain signal and the digital baseband scaling signal, is split using the programmed 80%-20% ratio where 80% of the gain relates to the RF gain control signal and is applied to the upconverter 208 over connection 256 and 20% of the gain is applied to the baseband section 204 over connection 252. Other RF AGC/baseband ratios can be implemented, based on system requirements.

In block 522, the RF AGC signal is determined based on the values in the lookup table 306-3 and applied to the upconverter 208; and the digital baseband scaling signal on connection 252 is determined based on the values in the lookup table 306-n and is applied to the baseband section 204 in the proportions described above.

If the power amplifier 151 is set in the high gain mode, then, in block 532, the appropriate attenuator value, in dB, is calculated according to Ga=Pmax−Phigh. The attenuator value is then applied based on the value in the lookup table 314.

In block 534, the power amplifier gain delta, Gpa, is calculated based on the DC DAC control signal on connection 242 and the bias control signal on connection 244.

In block 536, the appropriate transmit gain delta, Gtx, is calculated. The transmit gain, Gtx, is calculated according to Gtx=Phigh−Ptarget−Gpa.

In block 538, the RF AGC gain signal and the digital baseband scaling signal, is split using the programmed 80%-20% ratio where 80% of the gain relates to the RF gain control signal and is applied to the upconverter 208 over connection 256 and 20% of the gain is applied to the baseband section 204 over connection 252. Other RF AGC/baseband ratios can be implemented, based on system requirements.

In block 542, the RF AGC signal is determined based on the values in the lookup table 306-3 and applied to the upconverter 208; and the digital baseband scaling signal on connection 252 is determined based on the values in the lookup table 306-n and is applied to the baseband section 204.

Figure 6:
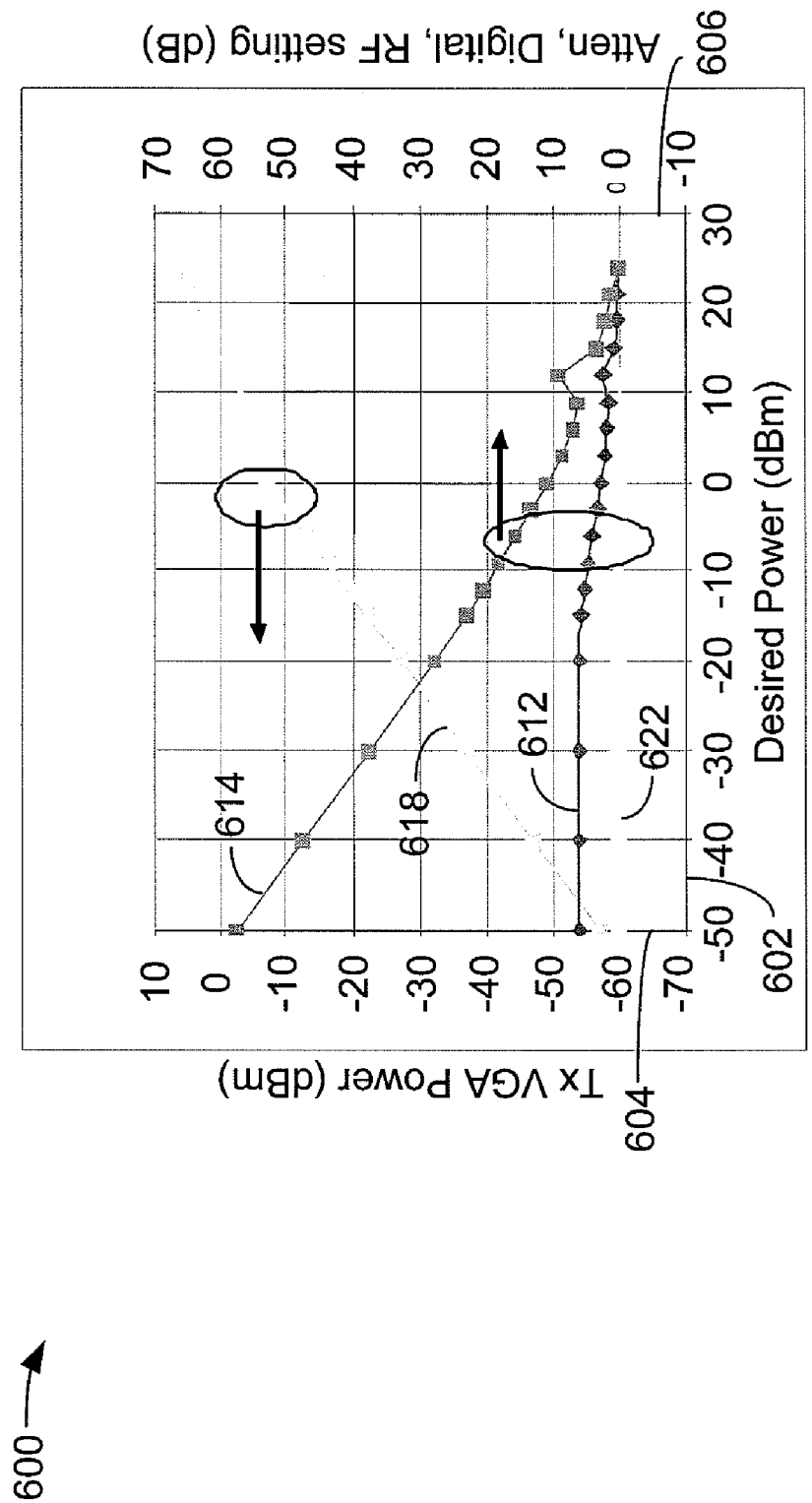
FIG. 6 is a graphical illustration showing division of gain control within the transmitter.

FIG. 6 is a graphical illustration 600 showing division of gain control within the transmitter 160. The abscissa 602 represents desired power in dBm, the left ordinate 604 represents the transmit power provided by the VGA in the driver 216 and the right ordinate 606 represents the attenuator setting, the digital baseband gain setting and the RF gain setting in dB. The trace 612 represents digital scaling applied by the digital baseband scaling signal on connection 252 and the corresponding gain adjustment provided by the digital/analog baseband section 204 in response to the digital baseband scaling signal. The trace 612 refers to the right ordinate 606.

The trace 614 shows the normalized RF gain scaling applied by the driver 216 of the upconverter 208 in response to the RF gain control signal 256 provided by the AGC DAC 234 in response to the RF AGC signal on connection 254. The trace 614 refers to the right ordinate 606.

The trace 618 shows the power output of the driver 216 on connection 218. The trace 618 refers to the left ordinate 604. The trace 622 shows the gain control provided by the switchable attenuator 220 as controlled by the attenuator control signal on connection 258. The trace 622 refers to the right ordinate 606.

Figure 7:
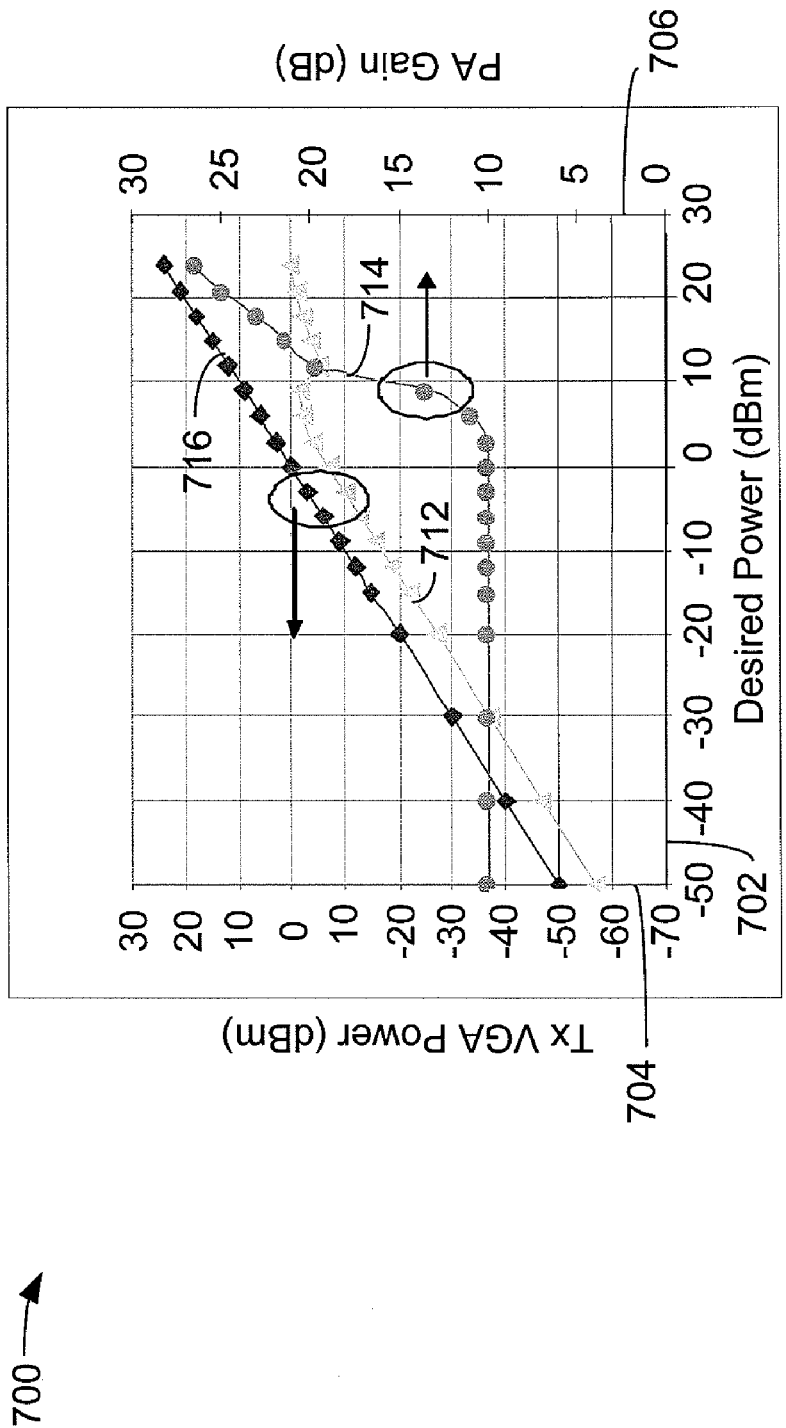
FIG. 7 is a graphical illustration showing the power control provided by the power control element.

FIG. 7 is a graphical illustration 700 showing the power control provided by the power control element 300. The abscissa 702 represents the desired power, Ptarget, in dBm, the left ordinate 704 represents transmitter/antenna output power in dBm and the right ordinate 706 represents power amplifier gain in dB. The trace 712 illustrates the transmit output power, Ptx, output from the attenuator 220 on connection 222. The trace 712 refers to the left ordinate 704. The trace 714 illustrates the gain of the power amplifier 151 as controlled by the signals on connections 238, 248 and 262. The trace 714 refers to the right ordinate 706. The trace 716 illustrates the antenna power, Pout, on connection 144. The trace 716 refers to the left ordinate 704.

Figure 8:
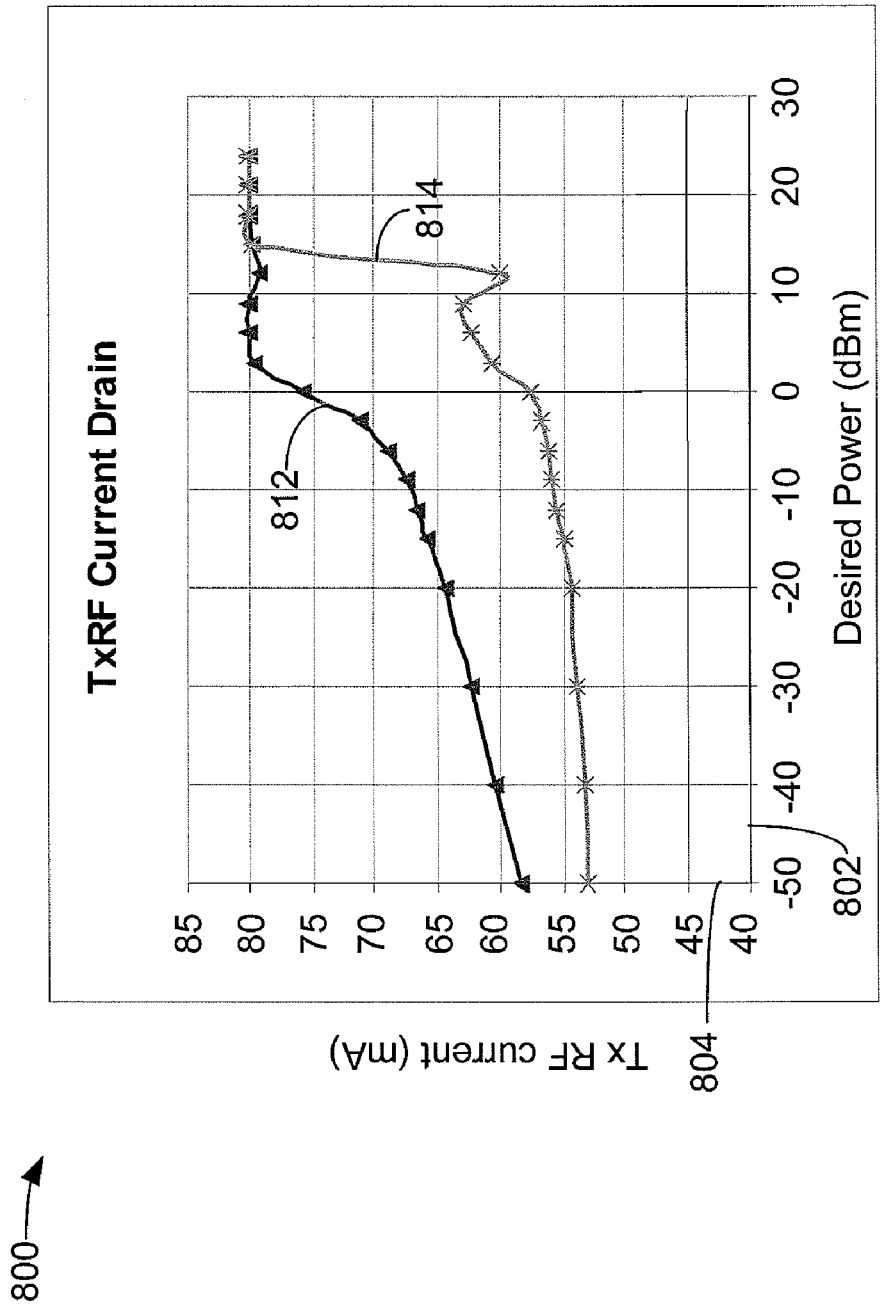
FIG. 8 is a graphical illustration showing a comparison of the current consumed in the transmitter with attenuator enabled at all power levels and with the attenuator disabled at low power levels.

FIG. 8 is a graphical illustration 800 showing a comparison of the current consumed in the transmitter 160 with the switchable attenuator 220 enabled at all power levels and with the switchable attenuator 220 disabled at low power levels. The abscissa 802 represents the desired power, Ptarget, in dBm and the ordinate 804 represents current in milliamps (mA) consumed by the transmitter 160. The switchable attenuator 220 is disabled when the desired output of the power amplifier moves from high gain to low gain mode, as controlled by the mode control signal, Vmode, on connection 262. The trace 812 shows the current consumed by the transmitter 160 when the attenuator 220 is always enabled and the trace 814 shows the current consumed by the transmitter 160 when the attenuator 220 is disabled in low-gain mode. As shown, the transmitter consumes significantly less current when the switchable attenuator 220 is disabled at low power.

FIG. 9 is a graphical illustration showing five power control regions controlled by the power control element 300. The abscissa 902 represents relative output power from a low power of Plow, to a high power of Pmax. The location on the abscissa 902 labeled Pmode is the point at which the power amplifier 151 is switched from low gain to high gain mode by the Vmode signal.

The ordinate 904 represents which of the active gain control blocks are active for a given region of gain control. The region 912 illustrates the highest gain control region where the RF attenuator 220 is employed to maintain receive band noise for a SAW less transmit system. The region 912 illustrates where only the switchable attenuator 220 is used to compensate for variations in gain of the elements in the transmitter 160 while maintaining an appropriate SNR.

The region 914 illustrates the gain control region between Pmode and Phigh where the switchable attenuator 220, along with the high gain mode control signal, Vmode, on connection 262, the VBA DAC 232, DC DAC 228, the AGC DAC 234, and the baseband digital scaling on connection 252 control the gain of the transmitter 160. The region 916 shows the gain control region where the power amplifier 220 is controlled by the Vmode signal to operate in a low gain mode. In the region 916, the transmitter gain is further controlled by the VBA DAC 232, DC DAC 228, the AGC DAC 234 and the digital baseband scaling applied over connection 252. The switchable attenuator 220 is disabled in this region.

The region 918 shows the operating region where the gain is controlled by the AGC DAC 234 and the digital baseband scaling on connection 252. The region 922 shows the gain control region where the gain in the transmitter 160 is controlled by the AGC DAC 234, which provides RF gain control only.

While various embodiments of the invention have been described, it will be apparent to those of ordinary skill in the art that many more embodiments and implementations are possible that are within the scope of the invention. For example, the invention is not limited to a specific type of communication device or receiver. Embodiments of the invention are applicable to different types of amplifiers, communication devices and receivers.

What is claimed is:

1. A power control system, comprising:
   a transmitter having a plurality of gain-adjustable elements;
   a switchable attenuator located at an output of the transmitter;
   a gain-adjustable power amplifier coupled to the switchable attenuator, the switchable attenuator being disabled when the gain-adjustable power amplifier operates in a low gain mode; and
   a power control element responsive to a power target signal, the power control element configured to calculate and apply a gain control signal to the plurality of gain-adjustable elements in the transmitter, to the switchable attenuator, and to the gain-adjustable power amplifier so that a signal to noise ratio (SNR) at the output of the transmitter remains substantially constant over a range of output power.

2. The power control system of claim 1 wherein the switchable attenuator is fixed.

3. The power control system of claim 1 wherein the switchable attenuator is variable.

4. The power control system of claim 3 wherein the switchable attenuator is compensated for temperature fluctuation.

5. The power control system of claim 1 wherein the switchable attenuator maintains the signal to noise ratio (SNR) at the output of the transmitter such that noise generated by the transmitter in at least one of a plurality of receive bands is reduced below a determined level.

6. A portable communication device having a power control system, comprising:
   a transmitter configured to receive a baseband information signal and configured to provide a modulated transmit signal, the transmitter including a plurality of gain-adjustable elements, a switchable attenuator located at an output of the transmitter, a gain-adjustable power amplifier coupled to the switchable attenuator, the switchable attenuator being disabled when the gain-adjustable power amplifier operates in a low gain mode, and a power control element responsive to a power target signal, the power control element configured to calculate and apply a gain control signal to the plurality of gain-adjustable elements in the transmitter, to the switchable attenuator, and to the gain-adjustable power amplifier so that a signal to noise ratio (SNR) at the output of the transmitter remains substantially constant over a range of output power; and
   a receiver configured to receive a radio frequency (RF) signal in at least one of a plurality of receive frequency bands.

7. The portable communication device of claim 6 wherein the switchable attenuator is fixed.

8. The portable communication device of claim 6 wherein the switchable attenuator is variable.

9. The portable communication device of claim 6 wherein the switchable attenuator maintains the signal to noise ratio (SNR) at the output of the transmitter such that noise generated by the transmitter in at least one of the plurality of receive frequency bands is reduced below a determined level.

10. A method for performing power control, comprising:
    receiving a power target signal in a transmitter;
    using the power target signal to develop a plurality of gain control signals for a plurality of gain-adjustable elements within the transmitter, to develop a plurality of gain control signals for a power amplifier, and to develop an attenuator control signal for a switchable attenuator;
    applying the pluralities of gain control signals and the attenuator control signal to maintain substantially constant a signal to noise ratio (SNR) at an output of the transmitter over a range of output power; and disabling the switchable attenuator when the power amplifier operates in a low gain mode.

11. The method of claim 10 wherein the switchable attenuator is fixed.

12. The method of claim 10 wherein the switchable attenuator is variable.

13. The method of claim 12 further comprising providing temperature compensation for the switchable attenuator.

14. The method of claim 10 further comprising maintaining the signal to noise ratio (SNR) at the output of the transmitter such that noise generated by the transmitter in at least one of a plurality of receive bands is reduced below a determined level.

* * * * *